(12) United States Patent
Robinson

(10) Patent No.: US 8,528,628 B2
(45) Date of Patent: Sep. 10, 2013

(54) CARBON-BASED APPARATUS FOR COOLING OF ELECTRONIC DEVICES

(75) Inventor: Stanley Robinson, Vista, CA (US)

(73) Assignee: Olantra Fund X L.L.C., Wilmington, DE (US)

( * ) Notice: Subject to any disclaimer, the term of this patent is extended or adjusted under 35 U.S.C. 154(b) by 1058 days.

(21) Appl. No.: 12/012,654

(22) Filed: Feb. 5, 2008

(65) Prior Publication Data

US 2008/0190586 A1    Aug. 14, 2008

Related U.S. Application Data

(60) Provisional application No. 60/900,111, filed on Feb. 8, 2007.

(51) Int. Cl.
H05K 7/20 (2006.01)
F28F 7/00 (2006.01)
F28D 15/00 (2006.01)

(52) U.S. Cl.
USPC ............. 165/80.4; 165/104.33; 165/104.31; 361/699

(58) Field of Classification Search
USPC ............. 165/80.4, 104.31, 104.33; 361/699
See application file for complete search history.

(56) References Cited

U.S. PATENT DOCUMENTS

| | | | |
|---|---|---|---|
| 4,109,707 A | 8/1978 | Wilson et al. | |
| 4,165,733 A * | 8/1979 | Middleton et al. | 126/588 |
| 4,392,362 A * | 7/1983 | Little | 62/51.1 |
| 4,450,472 A | 5/1984 | Tuckerman et al. | |
| 5,361,828 A | 11/1994 | Lee | |
| 5,388,635 A * | 2/1995 | Gruber et al. | 165/80.4 |
| 5,542,471 A * | 8/1996 | Dickinson | 165/170 |
| 5,628,363 A | 5/1997 | Dewar et al. | |
| 5,801,442 A | 9/1998 | Hamilton et al. | |
| 5,998,863 A | 12/1999 | Kobayashi et al. | |
| 6,301,109 B1 | 10/2001 | Chu | |
| 6,668,911 B2 | 12/2003 | Bingler | |
| 6,672,502 B1 | 1/2004 | Paul et al. | |
| 6,675,875 B1 | 1/2004 | Vafai et al. | |
| 6,692,700 B2 | 2/2004 | Handique et al. | |
| 6,736,195 B2 | 5/2004 | Busch et al. | |
| 6,785,134 B2 | 8/2004 | Maveety et al. | |
| 6,793,831 B1 | 9/2004 | Paul et al. | |
| 6,812,563 B2 | 11/2004 | Go et al. | |

(Continued)

OTHER PUBLICATIONS

Che Jianwei, et al., (Thermal Conductivity of Carbon Nanotubes, Mar. 2, 2000, Nanotechnology, 11, 65-69) discloses thermal conductivity across and along grain boundaries for structures composed substantially of carbon.*

(Continued)

Primary Examiner — Allen Flanigan
Assistant Examiner — Jason Thompson
(74) Attorney, Agent, or Firm — Knobbe Martens Olson & Bear, LLP

(57) ABSTRACT

A liquid cooling block consisting essentially of carbon for use with electric devices generating heat, comprising in combination; the cooling block contains grain in substantially normal orientation to the heat transfer surface between the cooling block and the electric device; a chamber with a bottom wall having prismatic projections for surface increase; the coolant is injected into the center of the cooling chamber and moves centrifugally towards block outlet channels in heat transfer relation with said projections; and, wherein the cooling block communicates with a cooler receiving coolant from the outlet channels of the liquid cooling block.

26 Claims, 8 Drawing Sheets

(56) References Cited

U.S. PATENT DOCUMENTS

| | | | |
|---|---|---|---|
| 6,844,054 B2 * | 1/2005 | Whatley | 428/295.4 |
| 6,865,081 B2 * | 3/2005 | Meyer et al. | 361/699 |
| 6,889,756 B1 * | 5/2005 | Hou | 165/104.33 |
| 6,894,899 B2 | 5/2005 | Wu | |
| 6,903,929 B2 * | 6/2005 | Prasher et al. | 361/699 |
| 6,904,966 B2 | 6/2005 | Philpott et al. | |
| 6,942,015 B1 | 9/2005 | Jenkins et al. | |
| 6,989,134 B2 | 1/2006 | Tonkovich et al. | |
| 6,991,024 B2 | 1/2006 | Goodson et al. | |
| 6,992,382 B2 | 1/2006 | Chrysler et al. | |
| 7,000,684 B2 | 2/2006 | Kenny et al. | |
| 7,048,723 B1 | 5/2006 | Frazier et al. | |
| 7,115,987 B2 * | 10/2006 | Holalkere et al. | 257/713 |
| 7,246,655 B2 | 7/2007 | Mochizuki | |
| 7,333,336 B2 | 2/2008 | Kim | |
| 7,414,843 B2 * | 8/2008 | Joshi et al. | 361/699 |
| 7,424,906 B2 | 9/2008 | Bhatti et al. | |
| 7,477,517 B2 * | 1/2009 | Khanna et al. | 361/704 |
| 7,599,626 B2 | 10/2009 | Popovich | |
| 7,694,722 B2 | 4/2010 | Popovich | |
| 8,037,927 B2 | 10/2011 | Schuette | |
| 2002/0011330 A1 * | 1/2002 | Insley et al. | 165/133 |
| 2003/0077449 A1 * | 4/2003 | Tzeng | 428/408 |
| 2004/0011511 A1 | 1/2004 | Ghosh et al. | |
| 2004/0052048 A1 | 3/2004 | Wu et al. | |
| 2005/0116336 A1 | 6/2005 | Chopra et al. | |
| 2005/0162833 A1 | 7/2005 | Chu | |
| 2005/0175838 A1 | 8/2005 | Greinke et al. | |
| 2005/0257917 A1 | 11/2005 | East | |
| 2006/0090885 A1 | 5/2006 | Montgomery et al. | |
| 2006/0137856 A1 * | 6/2006 | Popovich | 165/80.4 |
| 2006/0162903 A1 | 7/2006 | Bhatti et al. | |
| 2006/0162904 A1 | 7/2006 | Bhatti et al. | |
| 2006/0171801 A1 * | 8/2006 | Manabe et al. | 415/176 |
| 2006/0180300 A1 | 8/2006 | Lenehan et al. | |
| 2006/0191667 A1 | 8/2006 | Chen et al. | |
| 2007/0034356 A1 * | 2/2007 | Kenny et al. | 165/80.4 |
| 2007/0116957 A1 | 5/2007 | Pan et al. | |
| 2007/0227701 A1 | 10/2007 | Bhatti et al. | |
| 2007/0272392 A1 | 11/2007 | Ghosh | |

OTHER PUBLICATIONS

Che Jianwei, et al., (Thermal Conductivity of Carbon Nanotubes), Mar. 2, 2000, Nanotechnology, 11, 65-69).

* cited by examiner

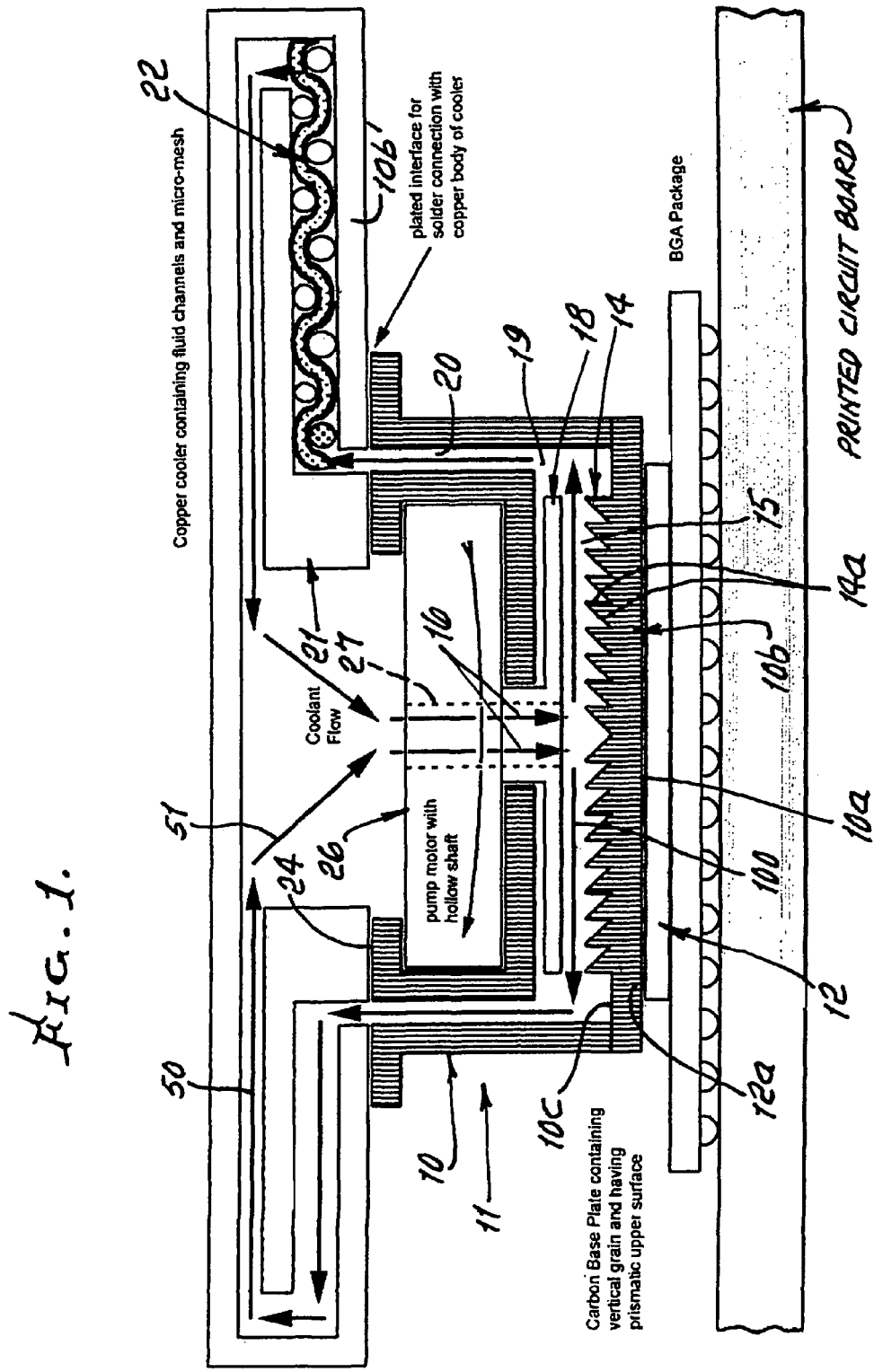

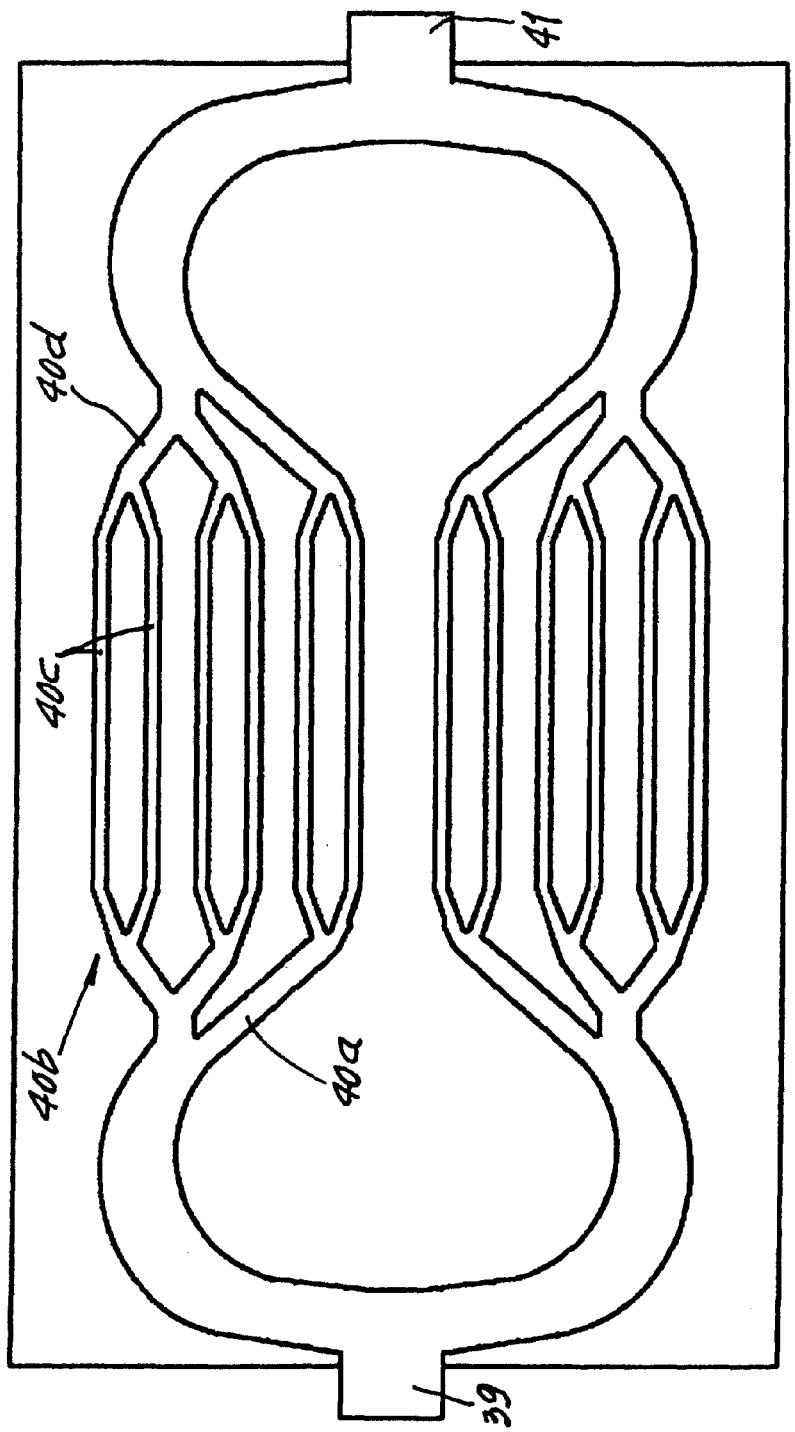

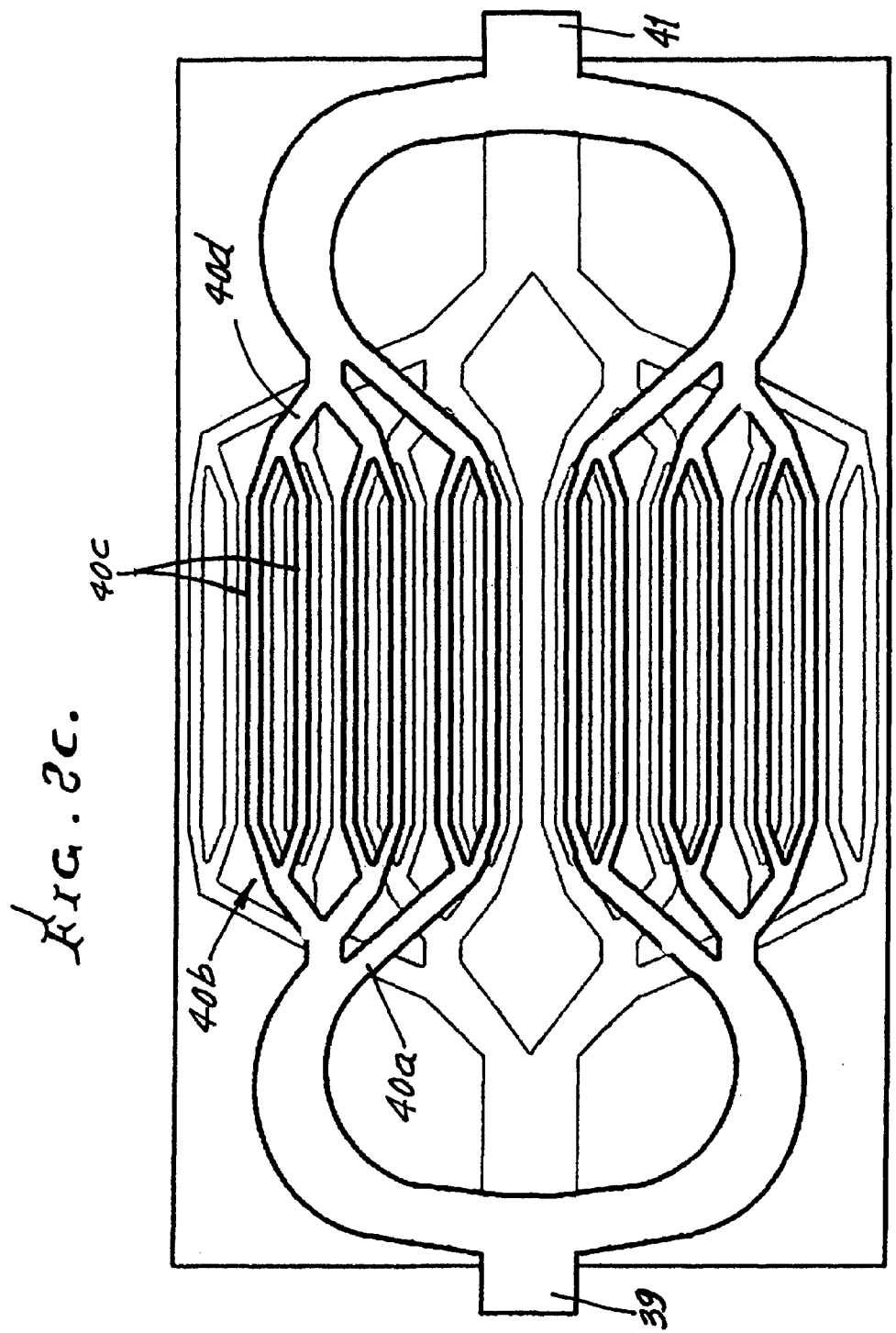

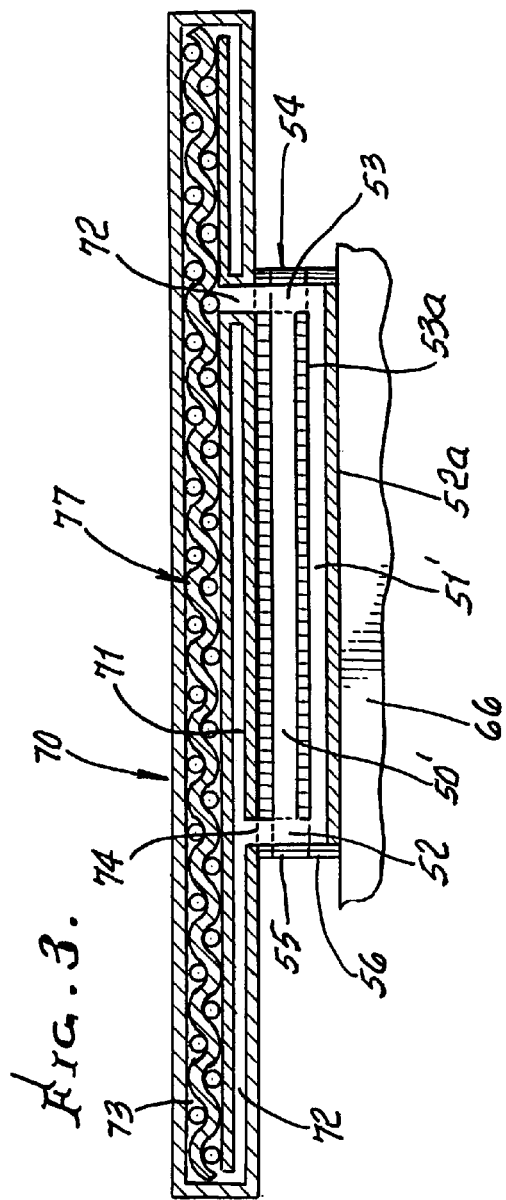
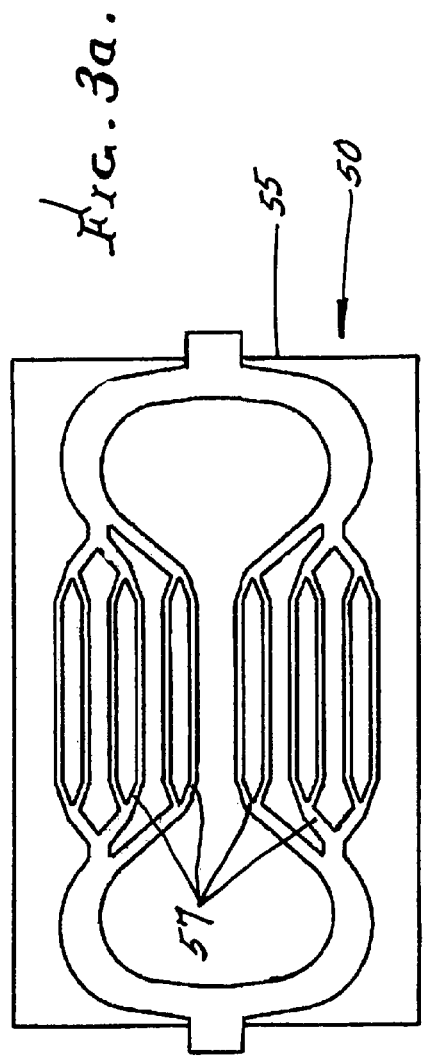

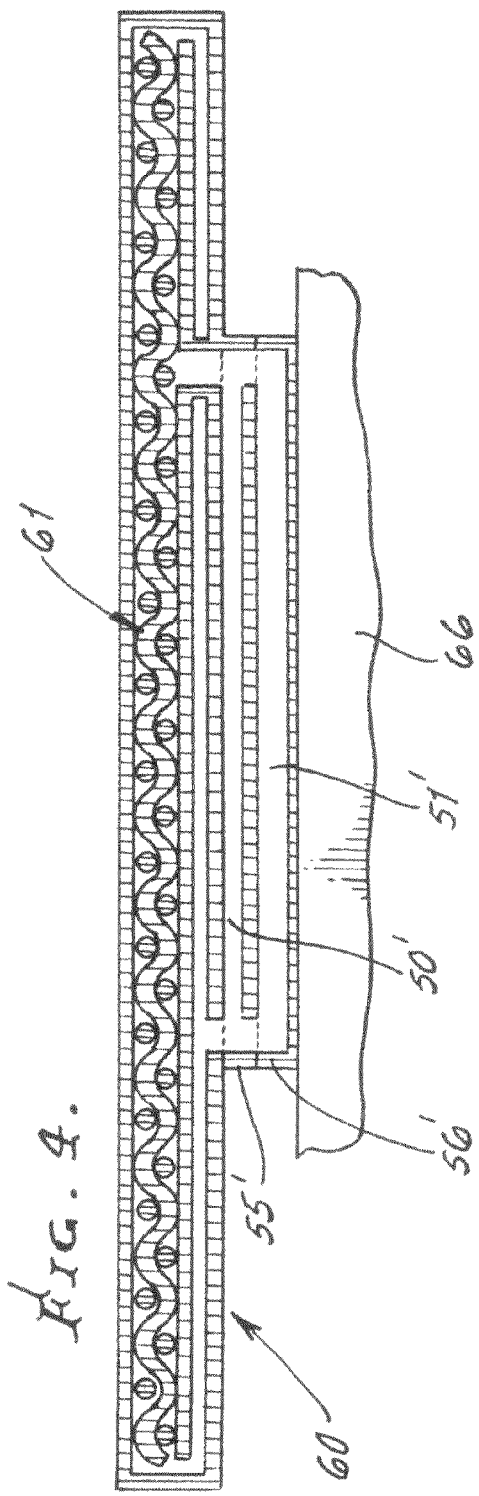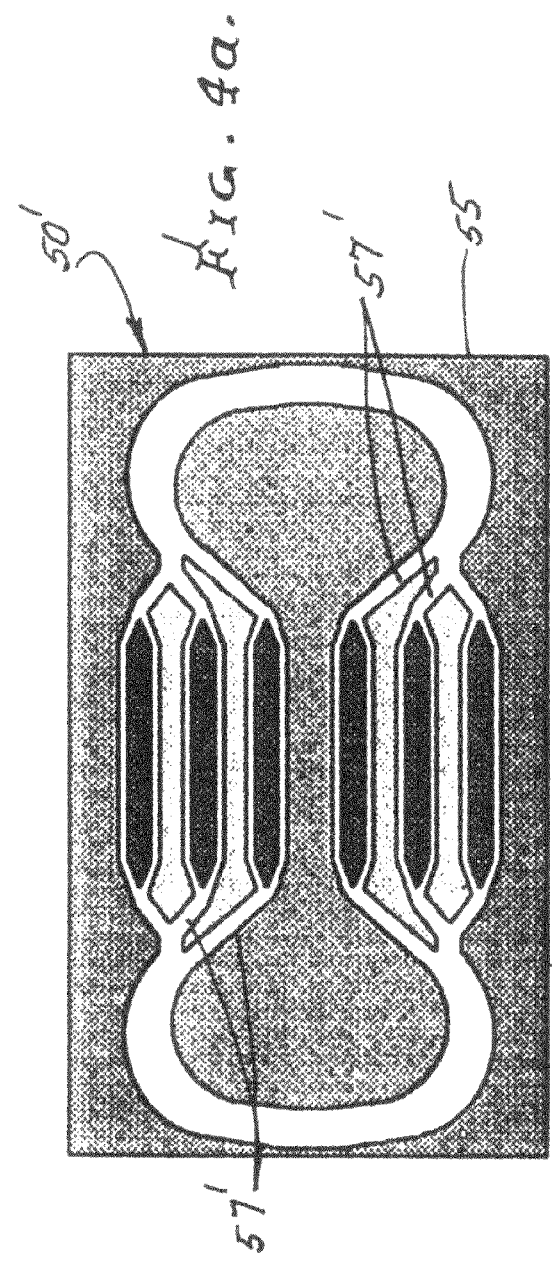

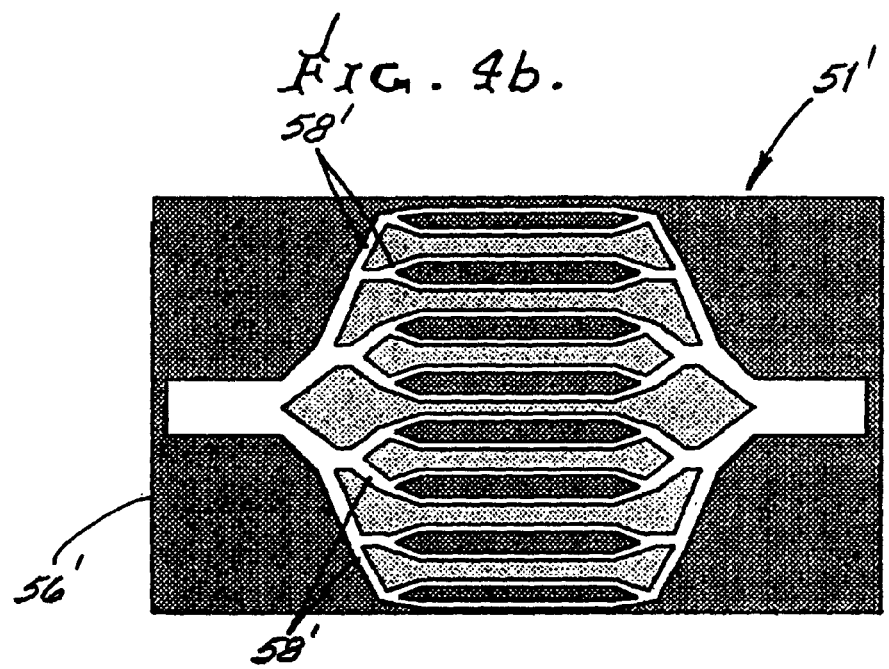
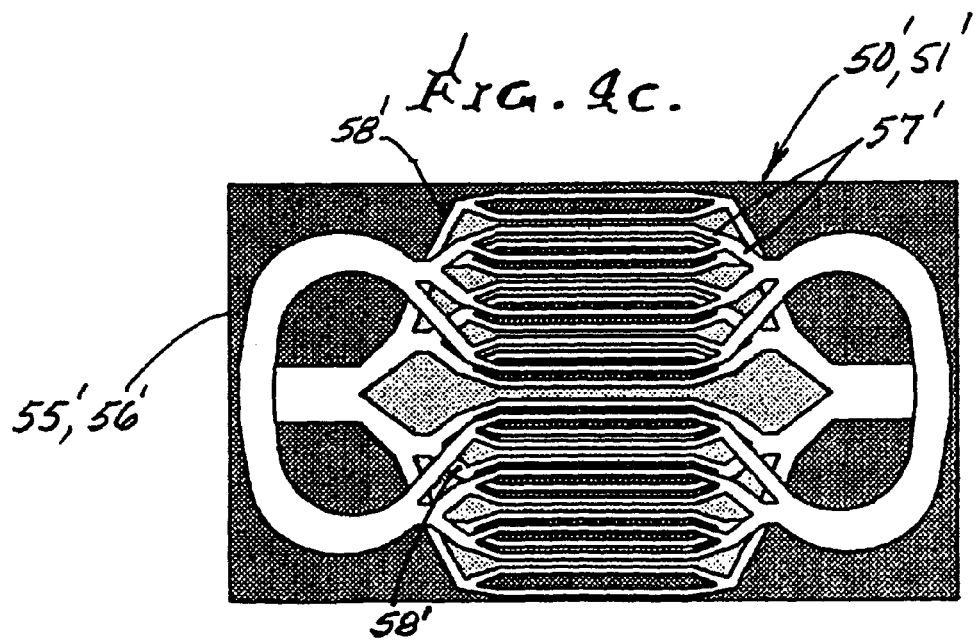

CARBON-BASED APPARATUS FOR COOLING OF ELECTRONIC DEVICES

BACKGROUND OF THE INVENTION

This application claims priority from provisional application Ser. No. 60/900,111 filed Feb. 8, 2007.

FIELD OF THE INVENTION

The evolution of electronic devices to more compact form factors and, specifically, the migration of semiconductor manufacturing to smaller design processes have increased the power densities of modern semiconductors orders of magnitude above that of older designs. Some of the areal power density increase is offset by reduced supply voltages and concurrent reduction in operating current. However, modern semiconductors also operate at much higher frequencies than their predecessors, which counteracts the savings stemming from lower voltages. Power density is equivalent to areal heat dissipation; as a result, the trend towards compact, high speed integrated circuits (ICs) results in higher thermal loads and, by extension, increasing challenges for cooling solutions.

An ideal objective for any cooling device is to maintain a uniform temperature distribution across the entire heat transfer surface. Uniform temperature distribution is also known as isothermicity and the preferred way of approaching this is to move heat as quickly and efficiently as possible from the source to any other part of the cooler. Compared to passive heat transfer through any solid material, active transport provides much higher efficacy of heat transport. A well-established example is the liquid cooling systems of combustion engines, where heat is taken up by water, which is pumped away from the engine to a remote radiator where the heat is then released into the environment. In the case of electronic devices, liquid cooling has been used in specialty designs but has not received general acceptance in mainstream consumer devices. Primary reasons for the lack of general acceptance comprise, among other factors, the inherent risk for spills, limited life expectancy of pumps, the cost overhead, the complexity of installation which includes routing of tubing and the configuration of more or less bulky radiators.

Any cooling system can only be as efficient as the primary interface responsible for the removal of thermal energy from the source. In the case of electronics, it appears as if the highest efficiency could be achieved by direct immersion of the semiconductor into the coolant. However, for all practical purposes, in the consumer space, this may not be a viable solution because of the reasons mentioned above. A more feasible solution entails a self-contained, sealed system. Sealed systems, on the other hand rely on the efficiency of the thermal interface between the semiconductor die and the coolant. In that particular area, certain solutions that have been proposed, are based on use of waterblocks machined from copper or silver. However, even copper or silver has a relatively low thermal conductivity compared to carbon structures, for example diamonds. Diamonds, on the other hand are not only too expensive for mainstream cooling devices, they are also close to impossible to machine into a suitable form. The recent discovery of carbon nanotubes and the exploration of their structural and thermal properties offer alternative possibilities for relatively inexpensive waterblocks, with high thermal exchange rates.

DESCRIPTION OF RELATED ART

Microchannels for fluid cooling have been established for several decades since the original work by Tuckerman and Pease as outlined in U.S. Pat. No. 4,450,472. The preferred embodiment featured microchannels integrated into the die of the microchip to be cooled and coolant chambers. U.S. Pat. No. 5,801,442 describes a similar apparatus. Subsequent inventions have concerned phase change designs with microchannels used for condensation, as outlined in U.S. Pat. No. 6,812,563. U.S. Pat. No. 6,934,154 describes a related two phase approach including an enhanced interface between the die and the heat spreader, based on a flip-chip design and the use of thermal interface material. U.S. Pat. Nos. 6,991,024, 6,942,015 and 6,785,134 describe electroosmotic pump mechanisms and vertical channels for increased efficiency of heat transfer. Variations of the microchannel design include vertical stacking of different orientational channel blocks as described in U.S. Pat. No. 6,675,875, flexible microchannel designs using patterned polyimide sheets as taught in U.S. Pat. No. 6,904,966 and integrated heating/cooling pads for thermal regulation as devised in U.S. Pat. No. 6,692,700.

Related art concerns the manufacturing of microchannels. U.S. Pat. Nos. 7,000,684, 6,793,831, 6,672,502, and 6,989,134, as representative examples, describe formation of microchannels by sawing, stamping, crosscutting, laser drilling, soft lithography, injection molding, electrodeposition, microetching, photoablation chemical micromachining, electrochemical micromachining, through mask electrochemical micromachining, plasma etching, water jet, abrasive water jet, electrodischarge machining (EDM), pressing, folding, twisting, stretching, shrinking, deforming and combinations thereof. An alternative method is taught in U.S. Pat. No. 7,048,723 using interconnected hollow micro-needles to establish a network. U.S. Pat. Nos. 6,793,831 and 6,672,502 describe materials used for the manufacturing of these microchannels as metals with high conductivity such as copper, aluminum, nickel or titanium, or alloys. A different method uses polycrystalline silicon as described in U.S. Pat. No. 6,992,382.

SUMMARY OF THE INVENTION

The present invention concerns provision of a cooling device utilizing the thermal transfer characteristics of carbon for enhanced heat removal from a semiconductor. Carbon is used for the construction of a water-block of a fluid cooling device, which serves as the interface between the semiconductor surface and the actual heat spreader or cooler. In short, the water block comprises a composite assembly with a base plate made from carbon containing vertical grains, with notches machined or formed with substantially acute angularity to the normal direction of the plate for surface increase, an intermediate structure containing fluid channels and a supporting structure that attaches to the heat spreader. In one embodiment, the coolant flows down through the center of the water block and then flows in centrifugal direction along the base plate to return to the heat spreader through peripheral collecting channels. The top surface of the carbon block is plated to allow for its soldering or attachment to a copper-based radiator through which the coolant is pumped and which dissipates the thermal energy to the environment.

Another embodiment uses a micro machined, opposite-end system of hierarchical channels, in which the intake branches out into a manifold of several generations of daughter branches, forming a capillary network over the heat source. The network continues into a substantially mirror-symmetric arrangement of channels converging into the outflow.

A third embodiment uses the opposite-end design of the water block in combination with a radiator manufactured or formed primarily from carbon rather than copper. Typically, the radiator contains a cavity defined by upper and lower plates running substantially in parallel relation with a mesh confined therebetween of roughly the same thickness as the cavity's height bonded in a thermally conductive manner to both plates. The interstices between the wires of the mesh, and between the mesh and the plates, form a secondary network of micro channels for fluid movement therein. The presence of the mesh increases the contact surface of the radiator in the fluid and thereby, the heat exchange rate between the radiator walls and the fluid.

UTILITY OF THE INVENTION

Important advantages of the invention can be summarized as follows:

a) optimized heat transfer from the heat source to the coolant;

b) notches in acute angle orientation to the ingrain of the carbon orientation increase surface area exposure to coolant, while maintaining largely constant thermal dissipation across the surface area;

c) advantageous scalability into large-scale cooling devices;

d) cost effectiveness because of inexpensive materials;

e) use of inert materials that are not prone to corrosion by coolant under extreme thermal conditions;

f) materials are saved, with environmental advantage.

These and other objects and advantages of the invention, as well as the details of an illustrative embodiment, will be more fully understood from the following specification and drawings, in which:

DRAWING DESCRIPTION

FIG. 1 shows a liquid cooler for an integrated circuit made of copper and containing a mesh for heat transfer from the liquid to the cooler walls. The cooler is soldered to a carbon-based water block containing vertically oriented grain. The coolant is injected centrally into the cooling chamber—in this case, using a centrifugal pump with a hollow shaft—and is driven towards the peripherally located outlet channels by the centrifugal rotor. The surface of the coolant chamber is machined to contain prismatic protrusions;

FIG. 2b shows a different variation of a hierarchical fluid channel system;

FIG. 2c shows an interleaved channel system in dual planes in which the channel-arrangement of the two planes is significant;

Figure 3B:
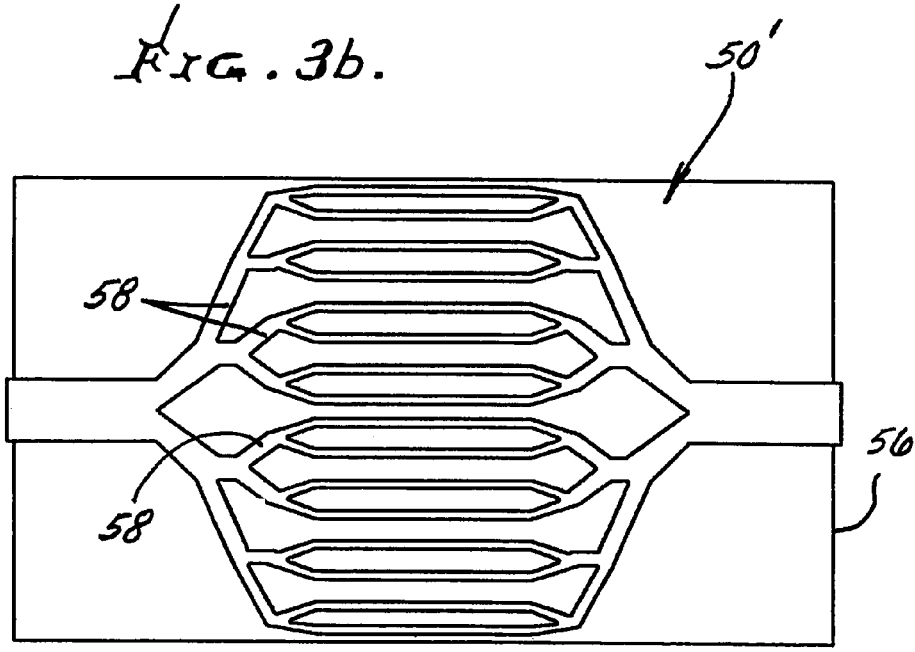
Figure 3C:
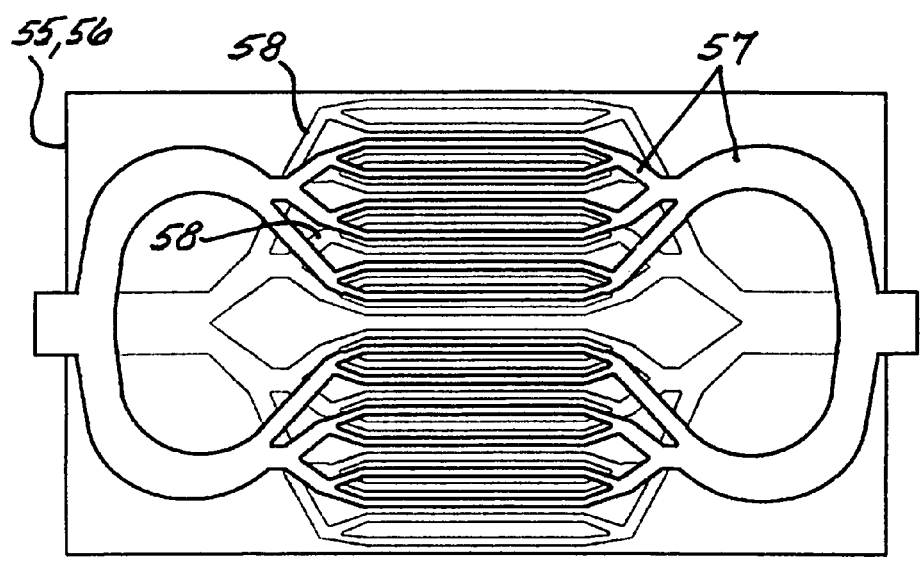

FIG. 3 shows the dual-plane carbon block attached to a copper cooler containing meshes for enhanced heat transfer. The carbon-based liquid cooling block comprises three plates, wherein the bottom and middle plates are machined to contain hierarchical channel systems. Alternatively, the top plate can be omitted for direct mounting of a composite channel liquid coolant block on the copper cooler; FIGS. 3a and 3b show block plates, superimposed in FIG. 3c.

FIG. 4 shows a dual-plane, interleaved channel, liquid cooling block integrated into a fully carbon-based cooler containing meshes for enhanced heat transfer. The grain is oriented preferentially in normal direction to the surface of the device to be cooled. FIGS. 4a and 4b show carbon block plates superimposed in FIG. 4c.

DETAILED DESCRIPTION OF THE INVENTION

As shown in FIG. 1, a preferred waterblock 10 is used in a sealed liquid cooling device 11. The waterblock is typically manufactured from carbon with a preferred orientation of the ingrain of the block nanotubes extending substantially normal in direction to the surface 12a of the semiconductor 12 to be cooled. Because thermal conductivity closely follows the orientation of the nanotubes, this orientation is advantageous for rapid removal of heat across the material. However, also because of the preferred direction of thermal conductivity in longitudinal alignment with the axial direction of the nanotubes, relatively little lateral spread of the thermal energy occurs. While this may appear disadvantageous for a conventional, passive cooling device, it allows concentration of the thermal release in sharply defined areas, which, in turn allows very effective heat removal through active fluid transport.

Typically, the "outer" surface 10a of the waterblock bottom plate 10b that is in contact with the semiconductor 12 to be cooled is machined or formed to provide as much contact with the semiconductor as possible. Examples encompass mirror-polishing of both the top surface layer of the semiconductor and of the opposing bottom surface 10a of the waterblock.

In one embodiment, the inner "surface" 10c of the waterblock bottom plate 10b is machined or formed to expose prism-like projections 14 extending into the fluid chamber 15. Because of the high conductivity of the carbon material, these prisms typically have surfaces 14a that form acute angles with their axial direction with only negligible loss in thermal conductance between the shortest and the longest parts of the prisms laterally. At the same time, however, the surface area exposed to the cooling fluid is greatly increased and, moreover, the projections or extrusions cause coolant micro-turbulences in the fluid flowing generally radially as indicated by arrows 100. Such micro-turbulences prevent laminar flow of the coolant across the bottom of the chamber that would negatively affect the heat exchange between the block material chamber and the fluid.

In this embodiment, a pump indicated by rotor 18 injects coolant to flow at 16 more or less into the center of the chamber from where it takes a centrifugal i.e. radial flow path or paths 100 across the prismatic bottom surface 10c towards the periphery 19 and then into outflow axial channels 20 leading into a radiator 21. The radiator is preferably a micro mesh-based isothermal plate and mesh assembly 22. The bottom plate 10b' can be a separate part of the assembly or part of the monolithic block 10. The top surface of the carbon-based waterblock is plated at 24 to allow a soldered connection to copper- or aluminum-based radiator 21. Coolant return flow is indicated by arrows 50 and 51, in radiator 21. A pump motor 26 is located within 10, and has a hollow shell 27 to pump flow 16.

Figure 2A:
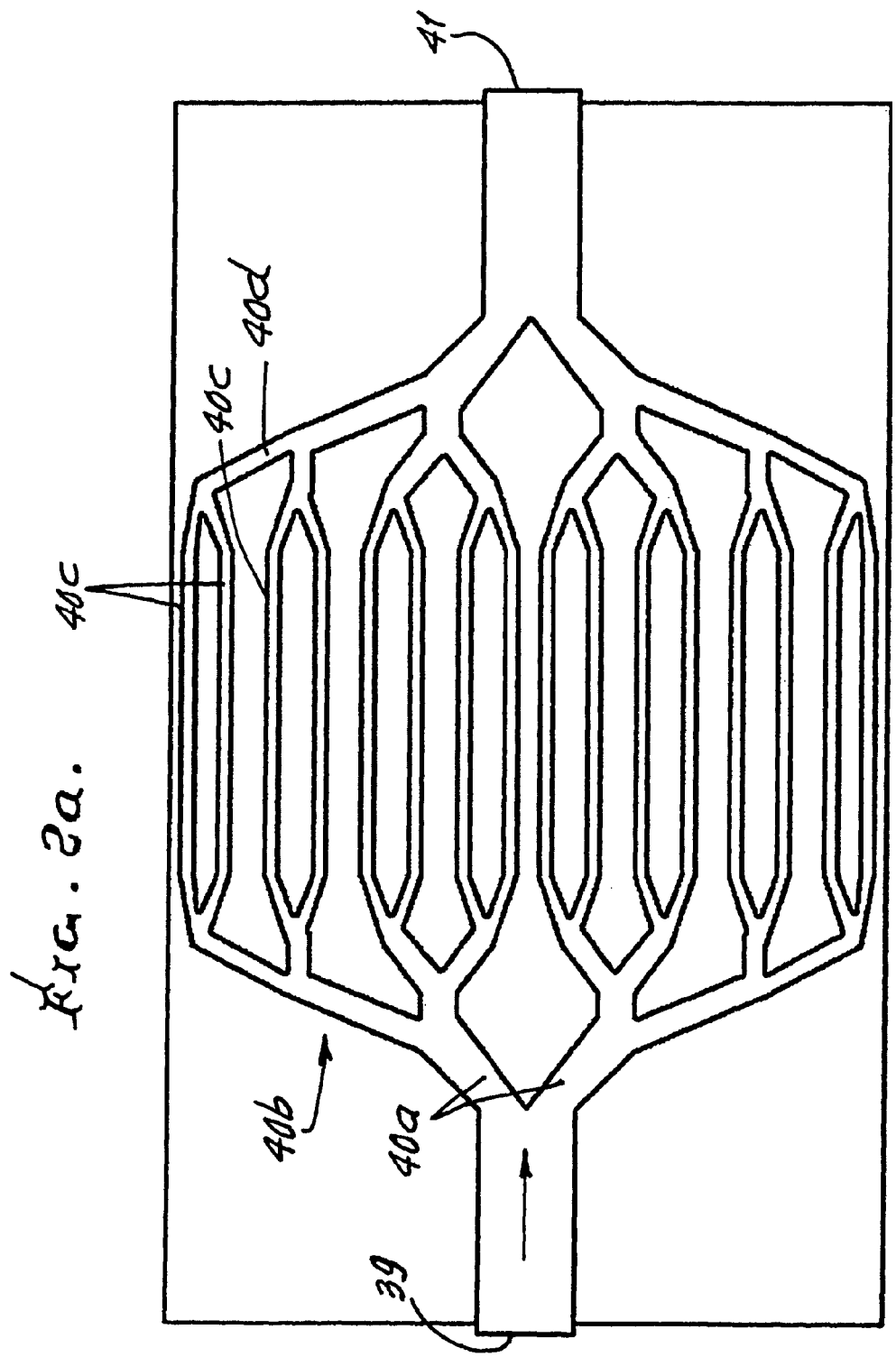
FIG. 2a shows a hierarchical channel system with opposite end intake and outflow as another embodiment of a carbon based liquid cooling block.

A second embodiment of the carbon-based waterblock uses opposite-end orientation of the fluid intake and outlet as in FIG. 2a. In this case, a primary intake 39, or inlet channel, supplies fluid to the carbon water block 40, inside of which it branches out at 40a into a hierarchical system 40b of several generations of daughter channels. As seen in FIG. 2a the end branches form a dense capillary network 40c over the targeted surface opposed to the heat source, i.e. electric device. The capillary network then converges at 40d in reverse order to a main outlet 41, or outlet channel, that feeds into a radiator or heat exchanger as at 21 above, in the form of an isothermal plate. Such a channel system is usable instead of, or supplementing, projections 14. As in the previous embodiment, the top surface of the carbon-based waterblock is plated to allow for a soldered connection with a copper or aluminum-based radiator. See also FIGS. 2b and 2c configurations.

A third embodiment of the invention uses a waterblock in combination with an isothermal plate containing micro-channels wherein the entire cooling structure is manufactured from carbon. A pump can be integrated into the design or used as an external pump.

A variation as seen in FIG. 3 of the second and third embodiments uses two parallel planes of hierarchical water channels 50' and 51', in carbon block 54 which takes advantage of the fact that especially with carbon blocks containing primarily unidirectional grain, as indicated by vertical lines, heat conductivity is very little attenuated by increased layer thickness, at least within the range relevant for this invention. Two sets of separated coolant channels are machined out of base plates 55 and 56 in a complementary pattern. That is, the branching coolant channels 57 in one plate overlap with the walls and branching channels 58 in the other plate, and vice versa as at 52, 53, 52a and 53a. See also FIG. 3c. Through this type of interleaved parallel plane channel system, the area coverage can be greatly increased while maintaining mechanical stability of the components. Mirror-polishing of the contact areas between the two superimposed plates, also warrants high thermal transfer between them. A heat conductive metal (such as copper) cooler 70 fits over the carbon block 54, as via a top carbon plate 71, and receives heated fluid in channels 72 and 73. Flow from block channels 57 and 58 passes at 74 into cooler lower channel 72, and then to cooler upper channel 73, and then edgewise through heat transfer mesh 77, to return at 78 to parallel plane channels 57 and 58. A highly compact efficient system is thus provided.

FIG. 4 shows a similar dual-plane, interleaved channel, liquid cooling block 60 integrated into a fully carbon-based cooler that contains meshes 61 for enhanced heat transfer. Thus, the meshes 61 and channels 50' and 51' are contained in the carbon block 60. The die to be cooled is indicated at 66. The grain is oriented preferentially in normal direction to the surface of the device to be cooled. Channels 57' and 58' are like channels 57 and 58, in block plates 55' and 56', like plates 55 and 56.

Also in FIGS. 3 and 4, coolant flow pumps may be provided in series with channels shown; see also channel system details.

I claim:

1. A liquid cooling system, comprising:
   a cooling block comprising carbon having a grain;
   the cooling block having a heat transfer surface on a first side of the block, the heat transfer surface configured to accept an electric device thereon, the grain being in substantially normal orientation to the heat transfer surface;
   a cooling chamber comprising a bottom wall having prismatic projections extending therefrom, the bottom wall defined by a second side of the cooling block, each prismatic projection having an axis generally normal to the bottom wall, a first surface parallel to the axis, and a second surface disposed at an acute angle relative to the axis, the cooling chamber having a coolant inlet;
   wherein coolant is injected through the coolant inlet into a center of the cooling chamber, prismatic projections being arranged on opposing sides of the coolant inlet, and moves centrifugally towards a cooling block outlet channel in heat transfer relation with said projections;
   wherein the cooling block communicates with a cooler receiving coolant from the cooling block outlet channel; and
   wherein the cooling block comprises carbon having nanotubes extending along the grain and substantially normal to the heat transfer surface and parallel to the axis of the prismatic projections, and the prismatic projections are oriented so that each second surface faces substantially toward the center of the bottom wall so that the coolant moving centrifugally from the center of the cooling chamber towards the block outlet channel flows directly across the second surfaces, and the prismatic projections cause coolant micro-turbulences in the moving coolant.

2. The liquid cooling system of claim 1 wherein the cooler contains mesh or meshes for enhanced heat transfer from the coolant.

3. The liquid cooling system of claim 2 where the cooler consists essentially of one of the following materials: copper, aluminum, carbon.

4. A liquid cooling system, comprising:
   a cooling block comprising carbon and having a heat transfer surface configured to accept a heat-generating electric device;
   the cooling block having a grain in substantially normal orientation to the heat transfer surface and comprising first and second plates arranged adjacent one another;
   the first and second plates each comprising a hierarchical micro-channel system having inlet and outlet sides, the first and second plates configured so that a coolant can enter the hierarchical micro-channel system at the inlet side and exit at the outlet side, the hierarchical micro-channel system comprising an inlet channel that splits into three or more generations of daughter micro-channels, which daughter micro-channels progressively combine into an outlet channel at the outlet side;
   first and second daughter micro-channels of the three or more generations of daughter micro-channels being formed on the first plate so as to be parallel and adjacent one another and separated by a first channel space, third and fourth daughter micro-channels of the three or more generations of daughter micro-channels being formed on the second plate so as to be parallel and adjacent one another and separated by a second channel space, the three or more generations of daughter micro-channels configured so that when the first and second plates are engaged the daughter micro-channels of the first and second plates are interleaved so that the first daughter micro-channel is disposed adjacent and aligned with the second channel space and the fourth daughter micro-channel is disposed adjacent and aligned with the first channel space;
   wherein the cooling block is in communication with a cooler receiving coolant from outlet channels defined by the cooling block; and
   wherein the cooling block comprises carbon having nanotubes that run with the grain and are substantially normal to the heat transfer surface and terminate at the micro-channels and spaces between the micro-channels.

5. The liquid cooling system of claim 4 wherein the cooler contains a screen or screens for enhanced heat transfer from the coolant flowing in a plane or planes of the screen or screens.

6. The liquid cooling system of claim 5 where the cooler consists essentially of one of the following materials: copper, aluminum, carbon.

7. A method of cooling an electric device, comprising:
   providing a liquid cooling block comprising carbon having a grain in substantially normal orientation to a heat transfer surface that is configured to accept an electric device thereon;
   directing coolant through a cooling chamber comprising a bottom wall having prismatic projections extending therefrom, the bottom wall defined by a second side of the liquid cooling block, each prismatic projection having an axis generally normal to the bottom wall, a first surface parallel to the axis, and a second surface disposed at an acute angle relative to the axis;

injecting the coolant into a center of the cooling chamber so that the coolant moves centrifugally towards outlet channels at or adjacent a periphery of the liquid cooling block;

directing the coolant from the liquid cooling block to a cooler and back to the liquid cooling block;

wherein the liquid cooling block comprises carbon having nanotubes extending along the grain and substantially normal to the heat transfer surface and parallel to the axis of the prismatic projections, the prismatic projections being positioned on opposite sides of the center of the bottom wall, and the prismatic projections are oriented so that their second surfaces face generally toward a center of the bottom wall; and directing the coolant within the chamber to flow directly across the second surfaces of the prismatic projections so that the prismatic projections cause coolant micro-turbulences in the moving coolant.

8. The method of claim 7 wherein the cooler is provided with screens for enhanced heat transfer.

9. The method of claim 8 where the cooler consists essentially of one of the following materials: copper, aluminum, carbon.

10. A method of cooling an electric device, comprising:

providing a liquid cooling block comprising carbon having a grain in substantially normal orientation to a heat transfer surface that is configured to accept an electric device thereon, the liquid cooling block having first and second plates arranged adjacent one another;

the first and second plates each comprising a hierarchical micro-channel system having inlet and outlet sides, each inlet side having an inlet channel that splits into three or more generations of daughter micro-channels, a plurality of last-generation daughter micro-channels not splitting into a further generation of daughter micro-channels, and the daughter micro-channels progressively combine into an outlet channel at the outlet side, first and second daughter micro-channels being last-generation daughter micro-channels that are formed on the first plate so as to be parallel and adjacent one another and separated by a first channel space, third and fourth daughter micro-channels being last-generation daughter micro-channels that are formed on the second plate so as to be parallel and adjacent one another and separated by a second channel space, and the first and second plates are engaged so that the first and second daughter micro-channels of the first plate are interleaved with the third and fourth daughter micro-channels of the second plate, and the first daughter micro-channel is disposed adjacent and aligned with the second space and the fourth daughter micro-channel is disposed adjacent and aligned with the first space;

directing coolant into the inlet side of each hierarchical micro-channel system so it passes through the hierarchical micro-channel system and exits at the opposite outlet side; and directing the coolant from the liquid cooling block to a cooler and back to the liquid cooling block;

wherein the liquid cooling block comprises carbon having nanotubes that run with the grain and are substantially normal to the heat transfer surface and terminate at the daughter micro-channels and first and second spaces between the micro-channels.

11. The method of claim 10 wherein the cooler is provided with screens, and additionally comprising directing the coolant through the screens.

12. The method of claim 11 where the cooler consists of one of the following materials: copper, aluminum, carbon.

13. The method of claim 10 additionally comprising providing a third plate having a second hierarchical micro channel system that extends in a substantial parallel direction and in a plane different from that of the first and second plate hierarchical micro-channel systems.

14. The method of claim 7 additionally comprising attaching an electric device onto the heat transfer surface.

15. The method of claim 10 additionally comprising attaching an electric device onto the heat transfer surface.

16. The liquid cooling system of claim 1, wherein the cooling block additionally comprises:

first and second plates arranged adjacent one another, the first and second plates each comprising a hierarchical micro-channel system having inlet and outlet sides, the first and second plates configured so that a coolant can enter the hierarchical micro-channel system at the inlet side and exit at the outlet side, the hierarchical micro-channel system comprising an inlet channel that splits into three or more generations of daughter micro-channels, which daughter micro-channels progressively combine into an outlet channel at the outlet side; and first and second daughter micro-channels of the three or more generations of daughter micro-channels being formed on the first plate so as to be parallel and adjacent one another and separated by a first channel space, third and fourth daughter micro-channels of the three or more generations of daughter micro-channels being formed on the second plate so as to be parallel and adjacent one another and separated by a second channel space, and the three or more generations of daughter micro-channels are configured so that when the first and second plates are engaged the daughter micro-channels of the first and second plates are interleaved so that the first daughter micro-channel is disposed adjacent and aligned with the second channel space and the fourth daughter micro-channel is disposed adjacent and aligned with the first channel space;

wherein nanotubes terminate at the micro-channels and spaces between the micro-channels.

17. The liquid cooling system of claim 4, wherein the first, second, third and fourth daughter micro-channels do not split into a further generation of daughter micro-channels.

18. The liquid cooling system of claim 17, wherein each new generation is formed by one of the micro-channels splitting into only two daughter micro-channels.

19. The liquid cooling system of claim 17 additionally comprising a fifth daughter micro-channel of the three or more generations of daughter micro-channels, the fifth daughter micro-channel being formed on the first plate, and the fifth daughter micro-channel does not split into a further generation of daughter micro-channels, wherein the first daughter micro-channel belongs to a different generation of daughter micro-channels than does the fifth daughter micro-channel.

20. The liquid cooling system of claim 4, wherein the inlet channel on the first plate splits into a first generation of daughter micro-channels at a location that is closer to the inlet side than is a location at which the inlet channel of the second plate splits into a first generation of daughter micro-channels.

21. The liquid cooling system of claim 4, wherein a portion of the first daughter micro-channel crosses a portion of the fourth daughter micro-channel.

22. The liquid cooling system of claim 4, wherein the first daughter micro-channel does not cross any micro-channel of the second plate.

23. The method of claim 7, wherein the liquid cooling block has first and second plates arranged adjacent one another, the first and second plates each comprising a hierarchical micro-channel system having inlet and outlet sides, each inlet side having an inlet channel that splits into three or more generations of daughter micro-channels, a plurality of last-generation daughter micro-channels not splitting into a further generation of daughter micro-channels, and the daughter micro-channels progressively combine into an outlet channel at the outlet side, first and second daughter micro-channels of the three or more generations of daughter micro-channels being last-generation daughter micro-channels that are formed on the first plate so as to be parallel and adjacent one another and separated by a first channel space, third and fourth daughter micro-channels of the three or more generations of daughter micro-channels being last-generation daughter micro-channels that are formed on the second plate so as to be parallel and adjacent one another and separated by a second channel space, and the first and second plates are engaged so that the first and second daughter micro-channels of the first plate are interleaved with the third and fourth daughter micro-channels of the second plate, and the first daughter micro-channel is disposed adjacent and aligned with the second space and the fourth daughter micro-channel is disposed adjacent and aligned with the first space, the method additionally comprising:

directing a coolant into the inlet side of each hierarchical micro-channel system so the coolant passes through the hierarchical micro-channel system and exits at the opposite outlet side; and wherein at least some of the nanotubes terminate at the daughter micro-channels and first and second spaces between the micro-channels.

24. The method of claim 10, wherein each new generation is formed by one of the micro-channels splitting into two daughter micro-channels.

25. The method of claim 24, wherein at least two of the last-generation daughter micro-channels are from different generations of micro-channels.

26. The method of claim 24, wherein each new generation is formed by one of the micro-channels splitting into only two daughter micro-channels.

\* \* \* \* \*